United States Patent
Cho et al.

(10) Patent No.: US 9,391,302 B2
(45) Date of Patent: Jul. 12, 2016

(54) ORGANIC LIGHT EMITTING DIODE DISPLAY

(71) Applicant: Samsung Display Co., Ltd., Yongin, Gyeonggi-Do (KR)

(72) Inventors: Sang-Hwan Cho, Yongin (KR); Soo-Youn Kim, Yongin (KR); Sang-Hyun Park, Yongin (KR); Yoon-Hyeung Cho, Yongin (KR); Seung-Yong Song, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/059,763

(22) Filed: Oct. 22, 2013

(65) Prior Publication Data

US 2014/0367648 A1    Dec. 18, 2014

(30) Foreign Application Priority Data

Jun. 17, 2013 (KR) .................. 10-2013-0069208

(51) Int. Cl.
*H01L 51/52* (2006.01)
*H01L 27/32* (2006.01)

(52) U.S. Cl.
CPC ........... *H01L 51/5281* (2013.01); *H01L 27/323* (2013.01); *H01L 2251/5338* (2013.01)

(58) Field of Classification Search
CPC ............. H01L 51/5281; H01L 27/323; H01L 2251/5338; H01L 51/50; H01L 51/52
USPC ................................. 313/498–512
See application file for complete search history.

(56) References Cited

U.S. PATENT DOCUMENTS

| | | |
|---|---|---|
| 5,049,780 A | 9/1991 | Dobrowolski et al. |
| 6,411,019 B1 | 6/2002 | Hofstra et al. |
| 6,545,409 B2 | 4/2003 | Kahen |
| 6,876,018 B2 | 4/2005 | Ko |
| 2002/0175619 A1* | 11/2002 | Kita et al. ............. 313/504 |
| 2004/0195967 A1* | 10/2004 | Padiyath .......... B32B 27/08 313/512 |
| 2005/0258441 A1* | 11/2005 | Shitagami ................ 257/88 |
| 2006/0269731 A1* | 11/2006 | Yoshikawa et al. ........ 428/212 |
| 2008/0225389 A1* | 9/2008 | Oh et al. ................ 359/486 |
| 2010/0244682 A1* | 9/2010 | Lee et al. ............... 313/512 |
| 2011/0260190 A1* | 10/2011 | Aoyama et al. ............ 257/98 |
| 2012/0049723 A1* | 3/2012 | Lee et al. ............... 313/498 |
| 2012/0280612 A1* | 11/2012 | Lee et al. ............... 313/504 |

(Continued)

FOREIGN PATENT DOCUMENTS

| | | | |
|---|---|---|---|
| GB | 2455916 A * | 7/2009 | ......... H01L 51/52 |
| JP | 2009-117500 A | 5/2009 | |

(Continued)

OTHER PUBLICATIONS

Renault et al., "A low reflectivity multilayer cathode for organic light-emitting diodes", Thin Solid Films, 379, 2000, pp. 195-198.

(Continued)

*Primary Examiner* — Donald Raleigh
(74) *Attorney, Agent, or Firm* — Cantor Colburn LLP

(57) ABSTRACT

An organic light emitting diode ("OLED") display includes a display panel; and a window on the display panel. The OLED display further includes an optical unit on the display panel, and including a metal material film and a dielectric material film.

11 Claims, 23 Drawing Sheets

(56) References Cited

U.S. PATENT DOCUMENTS

2012/0312677 A1* 12/2012 Kuriki ............................ 200/600
2013/0105770 A1*  5/2013 Pschenitzka .................... 257/40
2013/0234115 A1*  9/2013 Song et al. ..................... 257/40
2014/0118360 A1*  5/2014 Ma ............................ G02B 5/22
                                                         345/501
2014/0145150 A1*  5/2014 de Jong et al. ................. 257/40

FOREIGN PATENT DOCUMENTS

| KR | 1020000035364 A | 6/2000 |
| KR | 1020050052289 A | 6/2005 |
| KR | 1020060055060 A | 5/2006 |

OTHER PUBLICATIONS

Wu et al, "Contrast-enhancement in organic light-emitting diodes", Optics Express, vol. 13, No. 5, Mar. 7, 2005, pp. 1406-1411.

* cited by examiner

ORGANIC LIGHT EMITTING DIODE DISPLAY

This application claims priority to Korean Patent Application No. 10-2013-0069208 filed on Jun. 17, 2013, and all the benefits accruing therefrom under 35 U.S.C. §119, the entire contents of which are incorporated herein by reference.

BACKGROUND

1. Field

The described technology relates generally to an organic light emitting diode ("OLED") display.

2. Description of the Related Art

A display device is a device that displays an image. An OLED display as a display device has been drawing attention.

The OLED display has a self-light-emitting characteristic and does not require an additional light source, unlike a liquid crystal display device. Accordingly, the OLED display can improve a flexibility characteristic of a display device, by reducing the thickness and weight of the display device. The OLED display has high-quality characteristics such as low power consumption, high luminance, high response speed, and the like.

Such an OLED display is portable so as to be capable of being used in outdoor environments, and is manufactured to have reduced weight and thickness in order to satisfy the aforementioned object.

SUMMARY

One or more exemplary embodiment of the invention provides an organic light emitting diode ("OLED") display having advantages of having an improved flexibility characteristic by reducing the overall thickness and weight of the OLED display In addition, one or more exemplary embodiment of the invention provides an OLED display having increased visibility and contrast ratio.

An exemplary embodiment provides an OLED display, including: a display panel; an optical unit on the display panel and including a metal material film and a dielectric material film; and a window on the optical unit.

The metal material film may have an optical absorption rate of about 40% or higher and a refractive index ranging from about 0.5 to about 7.

The metal material film may include one of Al, Ag, Mg, Cr, Ti, Ni, Au, Ta, Cu, Ca, Co, Fe, Mo, W, Pt, Yb, and NiS, a combination thereof, or an alloy thereof, or include one of a metal oxide and a metal nitride, and a combination thereof, e.g., $CrO_x$, $CuO_x$, $MoO_x$, $TiN_x$, $TiN_xAl$, or $CrN_x$.

The dielectric material film may include one of $SiO_2$, $TiO_2$, LiF, $CaF_2$, $MgF_2$, SiNx, $Ta_2O_5$, $Nb_2O_5$, SiCN, $SiO_x$, $TiO_x$, $ZrO_2$, MgO, CaO, $Y_2O_3$, $ThF_4$, $YF_3$, $Al_xO_y$, $SiO_xN_y$, $ZrO_xF_y$, $SiO_xF_y$, $AlO_xN_y$, an acryl, a polymer acryl, a polyimide, a polycarbonate, polymethlymethacrylate, polystyrene, polyester, polyethylene, and polyethylene terephthalate, and a combination thereof.

A plurality of metal material films and a plurality of dielectric material films may be alternately stacked.

Transmittance of the optical unit may be about 43% or higher.

The display panel may include: a substrate; a plurality of organic light emitting elements on the substrate; and an encapsulation substrate configured to seal the organic light emitting elements.

The OLED display may further include a touch panel on the display panel.

Another exemplary embodiment provides an OLED display including: a substrate; a plurality of organic light emitting elements located on the substrate; an encapsulation substrate configured to seal the organic light emitting elements; and an optical unit on a surface of the encapsulation substrate which faces the organic light emitting elements. The optical unit includes a metal material film and a dielectric material film.

The metal material may have an optical absorption rate of about 40% or higher and a refractive index ranging from about 0.5 to about 7.

The metal material film may include one of Al, Ag, Mg, Cr, Ti, Ni, Au, Ta, Cu, Ca, Co, Fe, Mo, W, Pt, Yb, and NiS, or an alloy thereof, or a combination thereof, or may include one of a metal oxide and a metal nitride, and a combination thereof e.g., $CrO_x$, $CuO_x$, $MoO_x$, $TiN_x$, $TiN_xAl$, or $CrN_x$.

The dielectric material film may include one of $SiO_2$, $TiO_2$, LiF, $CaF_2$, $MgF_2$, $SiN_x$, $Ta_2O_5$, $Nb_2O_5$, SiCN, $SiO_x$, $TiO_x$, $ZrO_2$, MgO, CaO, $Y_2O_3$, $ThF_4$, $YF_3$, $Al_xO_y$, $SiO_xN_y$, $ZrO_xF_y$, $SiO_xF_y$, $AlO_xN_y$, an acryl, a polymer acryl, a polyimide, a polycarbonate, polymethlymethacrylate, polystyrene, polyester, polyethylene, and polyethylene terephthalate, and a combination thereof.

The metal material film and the dielectric material film may be provided in plural.

The plural metal material films and the dielectric material films may be alternately stacked.

Transmittance of the optical unit may be about 43% or higher.

According to one or more exemplary embodiment, an optical unit an OLED display suppresses external light reflection without having to employ a circular polarizing plate therein.

BRIEF DESCRIPTION OF THE DRAWINGS

The above and other features of this disclosure will become more apparent by describing in further detail exemplary embodiments thereof with reference to the accompanying drawings, in which:

FIG. 23 is a cross-sectional view of another modified exemplary embodiment of a display device including an optical unit in accordance with the invention.

DETAILED DESCRIPTION

Figure 1:
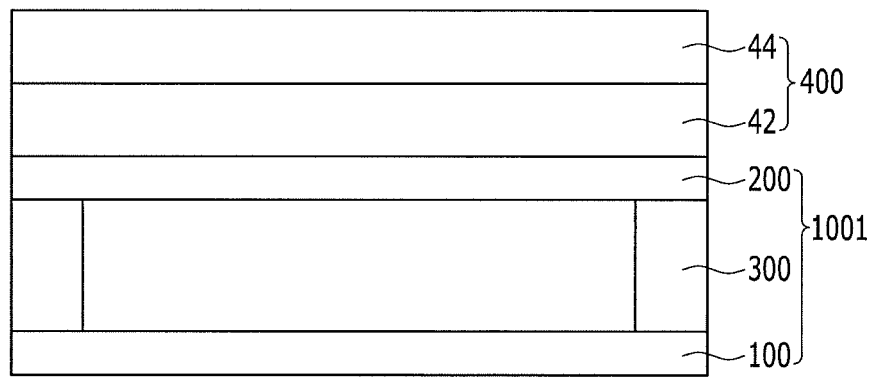
FIG. 1 is a cross-sectional view of an exemplary embodiment of a display device including an optical unit in accordance with the invention.

The invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the invention.

In the drawings, parts or elements that are not related to the description hereof are omitted in order to clearly describe the invention, and the same or like constituent elements designate the same reference numerals throughout the specification.

In addition, the size and thickness of each component shown in the drawings are arbitrarily shown for better understanding and ease of description, but the invention is not limited thereto.

In the drawings, the thickness of layers, films, panels, regions or the like are exaggerated for clarity. In the drawings, for better understanding and ease of description, the thickness of some layers and areas is exaggerated. Throughout this specification, when a first part of a layer, a film, a plate, or the like is described as being arranged "on" a second part, this indicates the first part is arranged on the second part directly or with a third part therebetween.

The terminology used herein is for the purpose of describing particular embodiments only and is not intended to be limiting of the invention. As used herein, the singular forms "a," "an" and "the" are intended to include the plural forms as well, unless the context clearly indicates otherwise. Further, throughout this specification, when a part is described as "comprising (or including)" constituent elements, this indicates that the part may further include other constituent elements unless particularly otherwise defined.

Furthermore, when the first part is described as being arranged "on" the second part, this indicates that the first part is arranged at an upper side or a lower side of the second part without the limitation to the upper side thereof on the basis of the gravity direction.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When an image of a display device such as an organic light emitting diode (OLED") display is viewed outdoors, contrast and visibility deteriorates since sunlight is reflected by a metal reflective layer within the display device. In order to solve such a problem, a circularly polarizing plate is disposed in the OLED display. The OLED display further includes an adhesion layer and a protection layer such as triacetyl cellulose ("TAC"), thereby increasing thickness and strength of the OLED display.

Since the OLED display includes multiple layers as described above, there is a limit in increasing flexibility of the OLED display. Further, there is a problem in that a possibility of forming defects caused by foreign particles and the like is increased during a process of manufacturing the OLED display because a plurality of layers are stacked therein. Therefore, there remains a need for an improved OLED display of which an image viewed outdoors has improved contrast and visibility.

Hereinafter, an exemplary embodiment of a display device including an optical unit in accordance with the invention will be described with reference to the drawings.

FIG. 1 is a cross-sectional view of an exemplary embodiment of a display device including an optical unit in accordance with the invention.

As shown in FIG. 1, an optical unit 400 of the display device includes a metal material film 42 disposed on a display panel 1001, and a dielectric material film 44.

The display panel 1001 includes a substrate such as a thin film transistor substrate 100 including an organic light emitting element (not shown), and an encapsulation substrate 200 facing the substrate 100 and serving to protect the organic light emitting element against external elements such as moisture and air. The substrate 100 and the encapsulation substrate 200 are coupled to each other by a sealing member 300, such that a space between the substrate 100, the encapsulation substrate 200 and the sealing member 300 is defined.

The metal material film 42 may include a metal having an optical absorption rate of about 40% or higher, a refractive index ranging from about 0.5 to about 7, and an absorption coefficient ranging from about 1.5 to about 7. In exemplary embodiments, for example, the metal may include one of chromium, molybdenum, tungsten, titanium, nickel and cobalt, and a combination thereof.

A cross-sectional thickness of the metal material film 42 is adjusted such that a transmittance thereof reaches about 43% or higher. As for the metal material film 42, a high light absorption rate caused by an increased thickness results in decreased external light reflection, improving contrast of the display device. However, the amount of light emitted from an emission layer of the organic light emitting element to outside the display device, is reduced so that the luminance of the display device is deteriorated.

Accordingly, the cross-sectional thickness of the metal material film is adjusted by using a material having an absorption rate of about 40% or higher such that a transmittance thereof reaches about 43%. The thickness of a metal having a high absorption rate is required to be smaller than that of a metal having a low absorption rate. A metal having a low absorption rate may be relatively thick as compared with a metal having a high absorption rate.

The dielectric material film 44 may include a transparent insulating material, e.g., one of $SiO_2$, $TiO_2$, LiF, $CaF_2$, $MgF_2$, $SiN_x$, $Ta_2O_5$, $Nb_2O_5$, and SiCN, and a combination thereof, and the dielectric material film 44 may have a cross-sectional thickness of about 1 micrometer ($\mu$m) or smaller.

Figure 2:
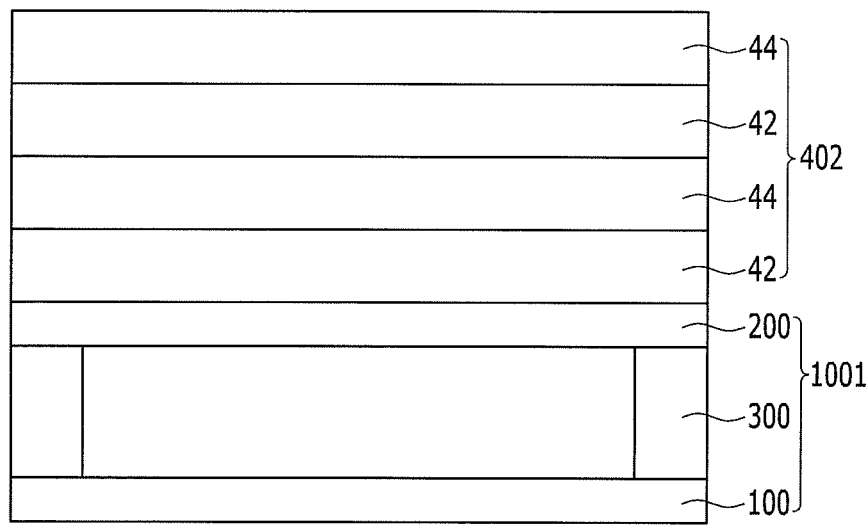
FIG. 2 to FIG. 4 are cross-sectional views of modified exemplary embodiments of display devices including optical units in accordance with the invention, respectively.
Figure 3:
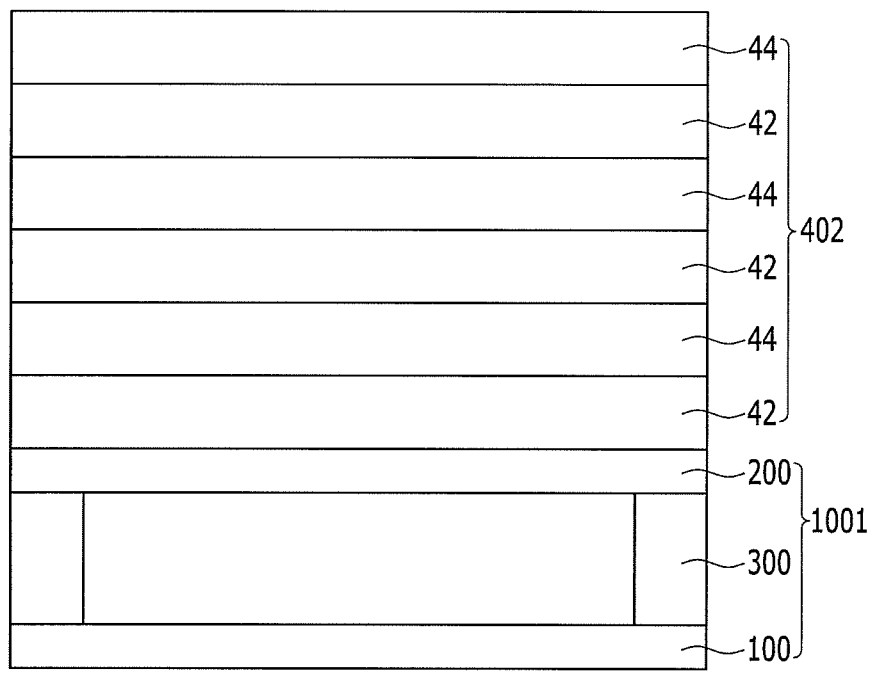
Figure 4:
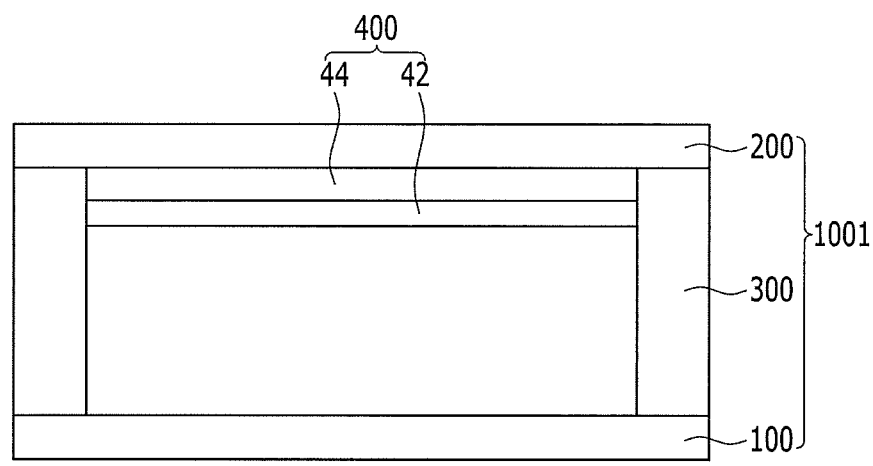

The metal material film 42 and the dielectric material film 44 of the optical unit 400 may be stacked in various ways as shown in FIG. 2 to FIG. 4.

FIG. 2 to FIG. 4 are cross-sectional views of modified exemplary embodiments of display devices including optical units in accordance with the invention.

As shown in FIG. 2, an optical unit 402 includes alternately stacked metal material films 42 and dielectric material films 44. A pair of films may include one metal material film 42 and one dielectric material film 44.

In FIG. 2, two pairs of films are stacked, such that the metal material film 42 and dielectric material film 44 are alternated two times. As shown in FIG. 3, three pairs of films are stacked, such that the metal-containing film 42 and the dielectric material film 44 are alternated three times. However, the invention is not limited thereto. In another exemplary embodiment, the metal material film 42 and dielectric material film 44 are alternated three times or more.

As the number of the metal-containing films 42 and the dielectric material films 44 to be stacked is increased, the absorption rate of the optical unit is increased while the transmittance is decreased. Accordingly, the cross-sectional thickness of the films to be stacked is adjusted in such a way so as to have the transmittance of the optical unit about 43% or higher. An overall thickness of the optical unit may be equal to or smaller than 3 μm. An individual thickness of the metal-containing films 42 may be equal to or smaller than about 0.5 μm. In an exemplary embodiment, a total thickness of the dielectric material films 44 in the optical unit may be equal to or smaller than about 2.5 μm.

All the metal material films 42 shown in FIG. 2 and FIG. 3 include a same material, and all the dielectric material films 44 include a same material. In alternative exemplary embodiments, the metal material films 42 and the dielectric material films 44 may respectively include different metal material films and different dielectric material films. In one exemplary embodiment, for example, the group of metal material films may include a first metal material film including silver and a second metal material film including chrome, and the group of dielectric material films may include a first dielectric material film including silicon oxide and a second dielectric material film including titanium oxide.

A plurality of metal material films and dielectric material films may be repeatedly stacked. Further, a first metal material film, a first dielectric material film, a second dielectric material film, and a second metal material film may be stacked in that order. These films may also be stacked randomly, for example, in the order of a first metal material film, a second metal material film, a first dielectric material film, a third metal material film, a second dielectric material film and a third dielectric material film.

Referring again to FIG. 1, the optical unit 400 is located on the encapsulation substrate 200 of the display panel 1001, but the invention is not limited thereto. In an alternative exemplary embodiment, the optical unit 400 may be located under the encapsulation substrate 200 and sealed together with the organic light emitting element (not shown), as illustrated in FIG. 4.

As described in the exemplary embodiments, when the optical unit includes stacked metal material films and dielectric material films, external light incident into the display device is reflected by the metal material film and a phase of the reflected light is varied depending on the thickness of the dielectric material film. By adjusting the thickness of the dielectric material film, the phase of the reflected light is opposite to that of the incident light, thereby generating destructive interference. Accordingly, the reflected light is extinguished. As a result, the external light reflection is suppressed to thereby improve the contrast of the display device including such optical unit.

Figure 5:
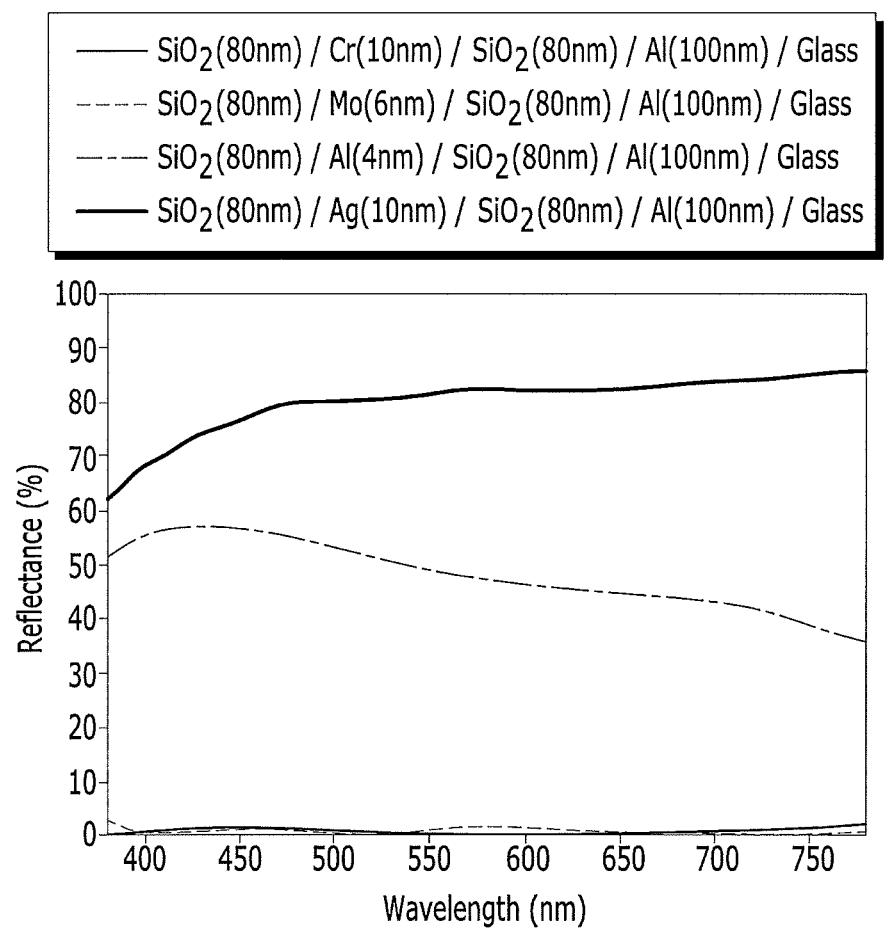
FIG. 5 and FIG. 6 are graphs showing reflectance (percent: %) measured according to wavelength (nanometers: nm) of exemplary embodiments of an optical unit in accordance with the invention.
Figure 6:
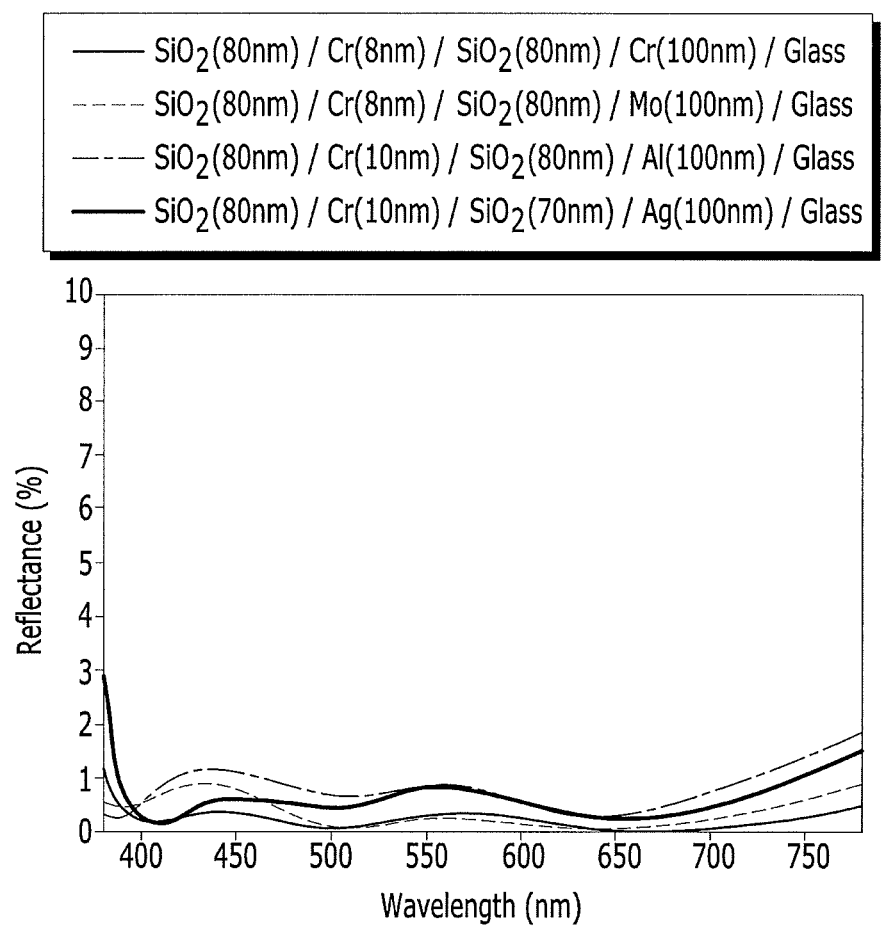

FIG. 5 and FIG. 6 are graphs showing reflectance in percent (%) measured according to wavelength in nanometers (nm) of exemplary embodiments of an optical unit in accordance with the invention, respectively.

Each of the optical units of FIG. 5 and FIG. 6 includes a stack of a metal material film, a dielectric material film, a metal material film and a dielectric material film in that order as shown in FIG. 2, and the dielectric material film includes silicon oxide.

The lower metal material films (adjacent to 'Glass') of FIG. 5 include a metal having high reflectance such as aluminum, and the upper metal material films respectively include silver, aluminum, molybdenum and chromium. The lower metal material films (adjacent to 'Glass') of FIG. 6 respectively include silver, aluminum, molybdenum and chromium, and the upper metal-containing films include chromium.

Referring to FIG. 5, it is seen that when the lower metal material films include the same material in each of the four optical units represented, the reflectance is varied depending on the material of the upper metal material film.

Referring to FIG. 6, it is seen that when the upper metal material films include the same material in each of the four optical units, the reflectance is maintained at 5% or lower even though the lower metal material film includes various materials.

As such, the reflectance is substantially constant regardless of the materials of the lower metal material film among the multiple metal material films of the optical unit, closest to the display panel, and the variation in reflectance depends on the material of the upper metal material film furthest from the display panel and closest to the exterior of the optical unit. Accordingly, in one or more exemplary embodiment, a metal of the upper metal material film located separated from the display panel as compared with the lower metal material film, has lower reflectance and a higher absorption rate than those of the lower metal material film.

Hereinafter, reflectance and transmittance will be comparatively described for an exemplary embodiment of an OLED display including an optical unit in accordance with the invention and a conventional OLED display including a polarizing plate.

Comparative Example 1

According to the conventional art, the OLED display includes a circular polarizing plate.

Test Example 1

In an exemplary embodiment of an OLED display including an optical unit in accordance with the invention, the optical unit includes a stacked structure including chromium, silicon oxide, chromium and silicon oxide in that order with thicknesses of 3 nm, 50 nm, 5 nm and 70 nm, respectively.

Test Example 2

In another exemplary embodiment of an OLED display including an optical unit in accordance with the invention, the optical unit includes a stacked structure including chromium, silicon oxide, chromium and silicon oxide in that order with thicknesses of 3.5 nm, 30 nm, 5.5 nm, and 70 nm, respectively.

Test Example 3

In another exemplary embodiment of an OLED display including an optical unit in accordance with the invention, the optical unit includes a stacked structure including silver, silicon oxide, chromium and silicon oxide in that order with thicknesses of 8 nm, 30 nm, 3 nm, and 50 nm, respectively.

Test Example 4

In another exemplary embodiment of an OLED display including an optical unit in accordance with the invention, the optical unit includes a stacked structure including chromium, silicon oxide, chromium, silicon oxide, chromium and silicon oxide in that order with thicknesses of 3.5 nm, 30 nm, 5.5 nm, 40 nm, 3.5 nm and 70 nm, respectively.

Test Example 5

In another exemplary embodiment of an OLED display including an optical unit in accordance with the invention, the optical unit includes a stacked structure including silicon oxide, titanium oxide, silver, silicon oxide, chromium and silicon oxide in that order with thicknesses of 50 nm, 30 nm, 10 nm, 30 nm, 9 nm and 50 nm, respectively.

Test Example 6

In another exemplary embodiment of an OLED display including an optical unit in accordance with the invention, the optical unit includes a stacked structure including molybdenum, silicon oxide, molybdenum and silicon oxide in that order with thicknesses of 3.0 nm, 60 nm, 3.0 nm and 80 nm, respectively Test Example 7

In another exemplary embodiment of an OLED display including an optical unit in accordance with the invention, the optical unit includes a stacked structure including aluminum, silicon oxide, chromium and silicon oxide in that order with thicknesses of 6.0 nm, 30 nm, 5.0 nm and 50 nm, respectively FIG. 7, FIG. 9, FIG. 11, FIG. 13, FIG. 15, FIG. 17 and FIG. 19 are graphs showing reflectance (%) measured according to wavelengths (nm) of Comparative Example 1 (Polfilm), versus Test Example 1 to Test Example 7 (Polfree), respectively. Further, FIG. 8, FIG. 10, FIG. 12, FIG. 14, FIG. 16, FIG. 18 and FIG. 20 are graphs showing transmittance (%) measured according to wavelengths (nm) of Comparative Example 1 (Polfilm), versus Test Example 1 to Test Example 7 (Polfree), respectively.

Figure 7:
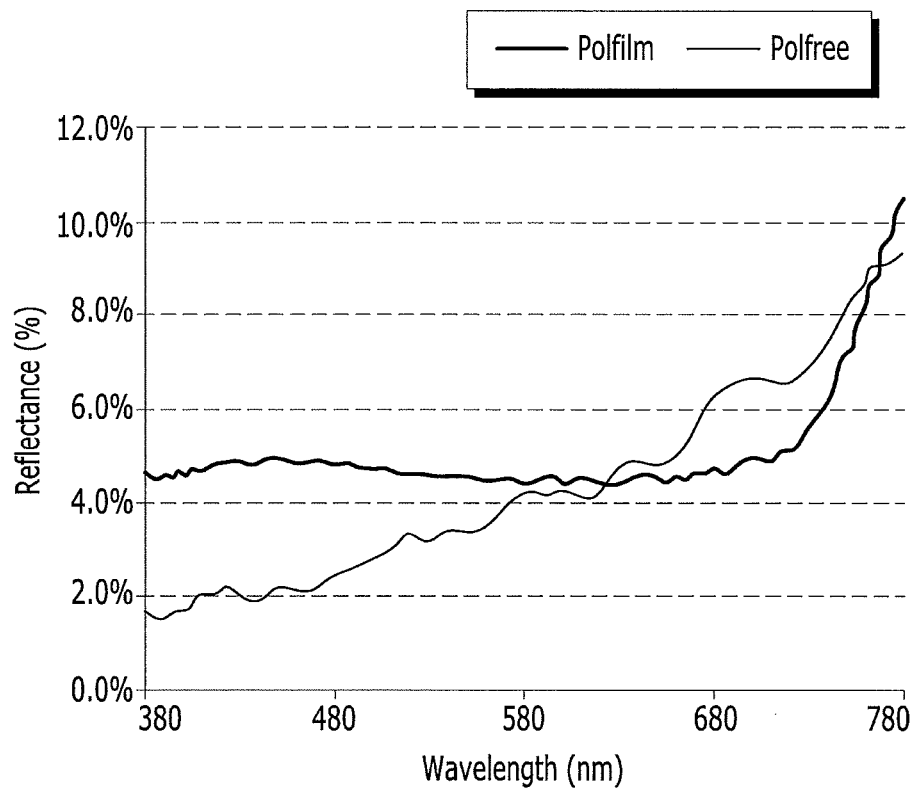
FIG. 7, FIG. 9, FIG. 11, FIG. 13, FIG. 15, FIG. 17 and FIG. 19 are graphs showing reflectance (percent: %) measured according to wavelengths (nanometers: nm) of Comparative Example 1, versus Test Example 1 to Test Example 7, respectively.

From FIG. 7 which is a graph obtained by measuring the reflectance of Comparative Example 1 and Test Example 1, it is seen that the reflectance according to wavelengths of Comparative Example 1 and Test Example 1 shows similar values in the entire visible wavelength range. Luminous reflectance for determining visibility is 4.6% and 3.6% in Comparative Example 1 and Test Example 1, respectively. This is a similar level to that of the polarizing plate.

Figure 8:
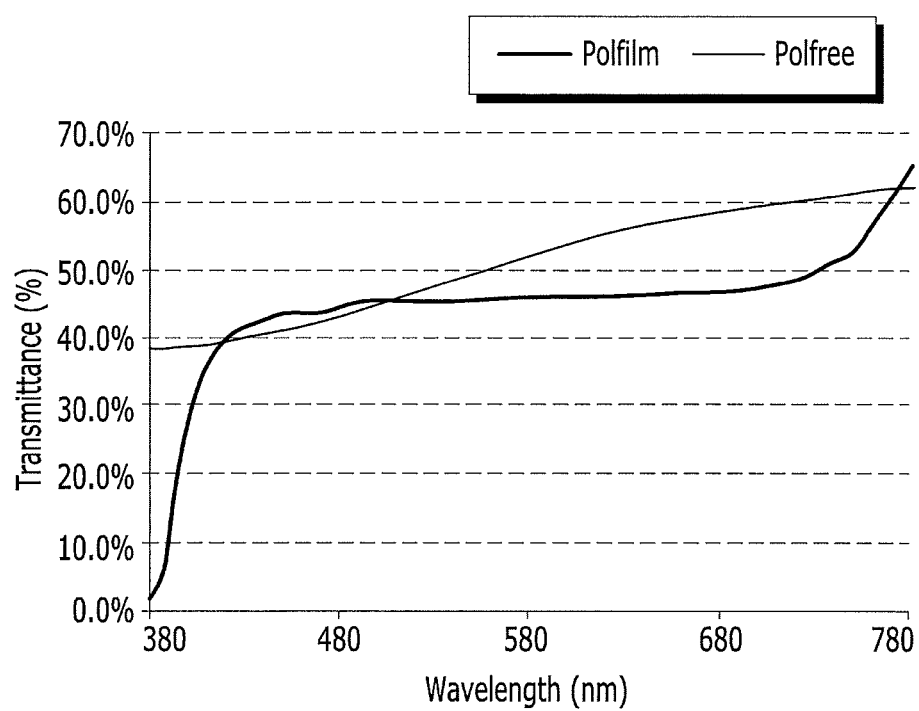
FIG. 8, FIG. 10, FIG. 12, FIG. 14, FIG. 16, FIG. 18 and FIG. 20 are graphs showing transmittance (percent: %) measured according to wavelengths (nanometers: nm) of Comparative Example 1, versus Test Example 1 to Test Example 7, respectively.

From FIG. 8 which is a graph obtained by measuring the transmittance of Comparative Example 1 and Test Example 1, it is seen that white efficiencies of Comparative Example 1 and Test Example 1 are compared and resultantly turned out to be substantially identical to each other.

Figure 9:
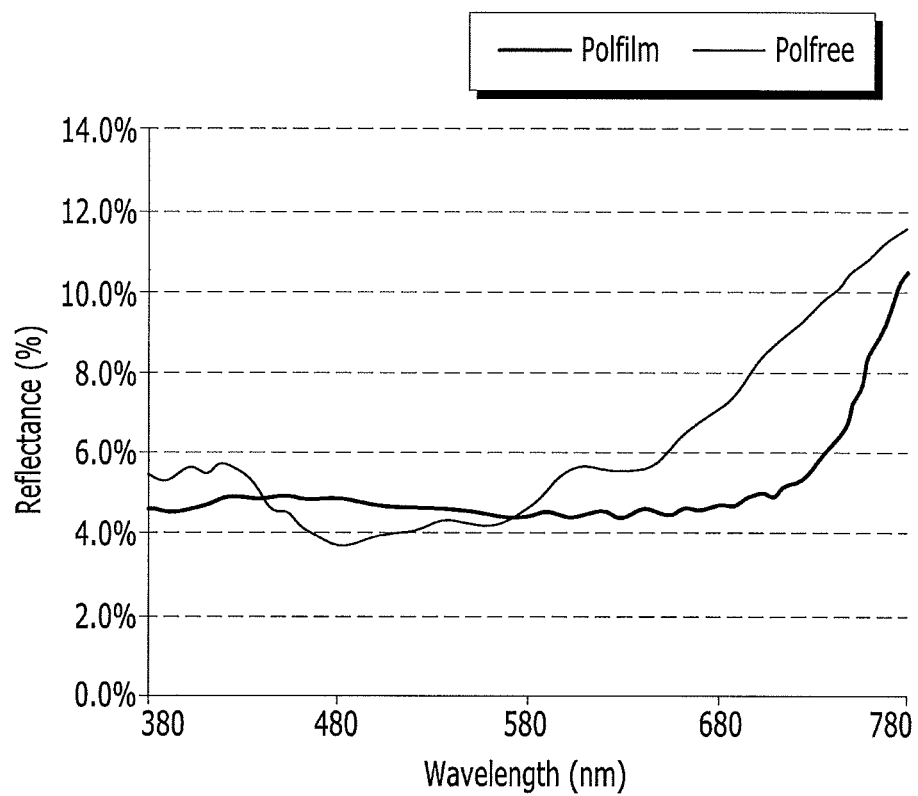

From FIG. 9 which is a graph obtained by measuring the reflectance of Comparative Example 1 and Test Example 2, it is seen that the reflectance according to wavelengths of Comparative Example 1 and Test Example 2 shows similar values in the entire visible wavelength range. The luminous reflectance for determining visibility is 4.6% and 4.5% in Comparative Example 1 and Test Example 2, respectively, which are at substantially the same level.

Figure 10:
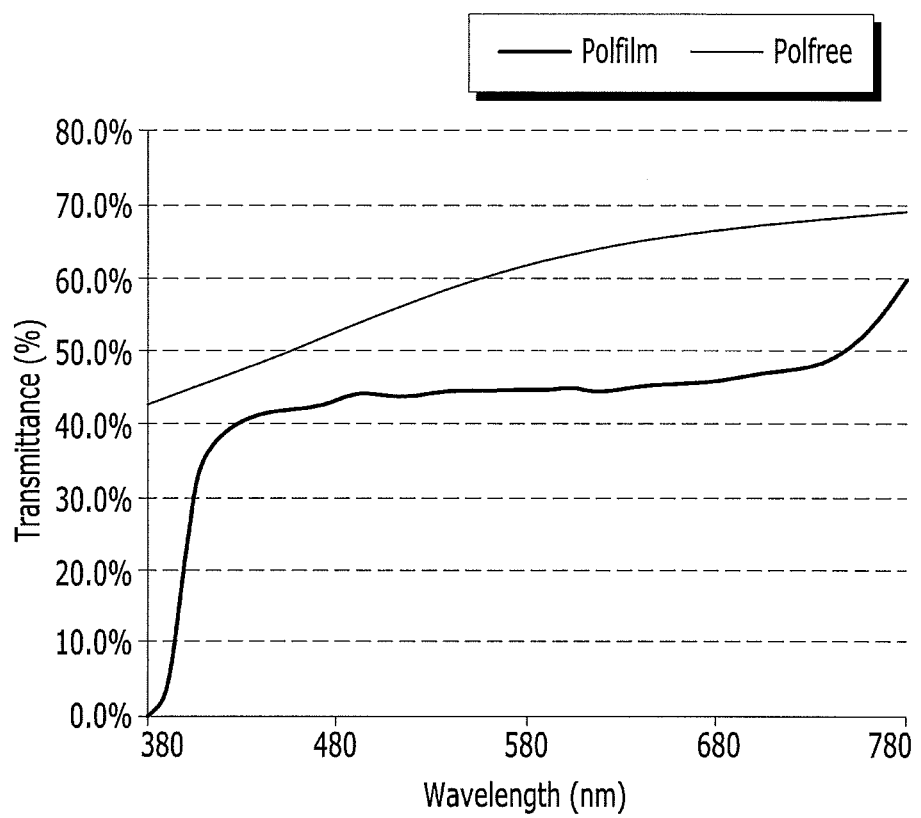

From FIG. 10 which is a graph obtained by measuring the transmittance of Comparative Example 1 and Test Example 2, it is seen that Test Example 2 shows higher transmittance than an average transmittance of 43% in the Comparative Example 1.

Figure 11:
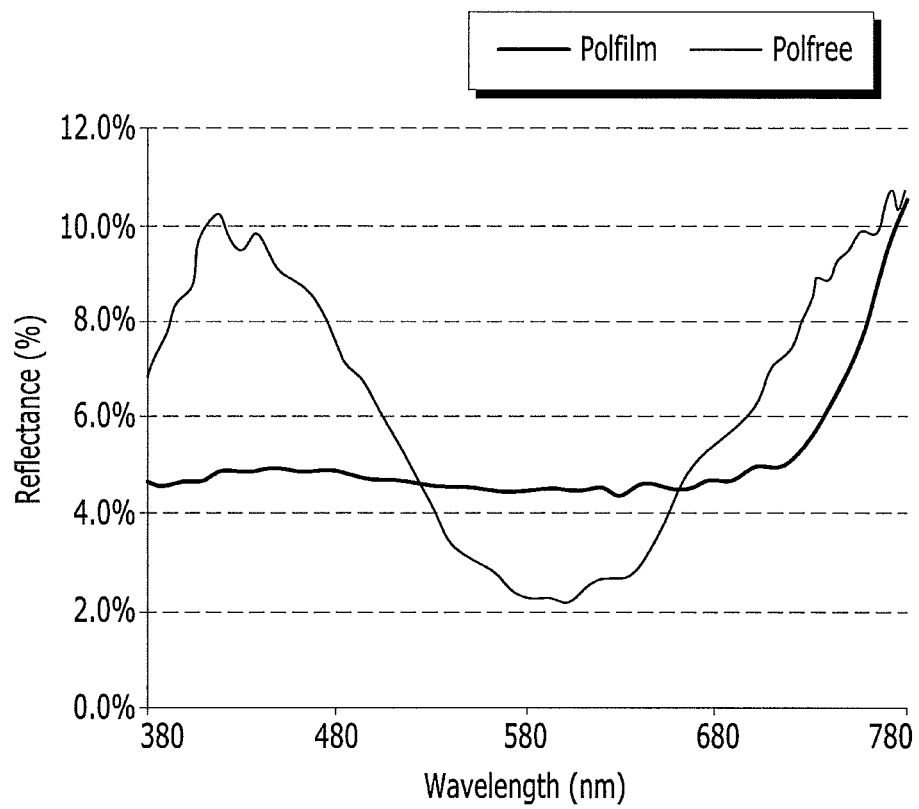

From FIG. 11 which is a graph obtained by measuring the reflectance of Comparative Example 1 and Test Example 3, it is seen that the reflectance according to wavelengths of Comparative Example 1 and Test Example 3 shows similar values in the entire visible wavelength range. The luminous reflectance for determining visibility is 4.6% and 3.6% in Comparative Example 1 and Test Example 3, respectively. That is, the luminous reflectance in Comparative Example 1 is smaller than that in Test Example 3, showing a high contrast ratio.

Figure 12:
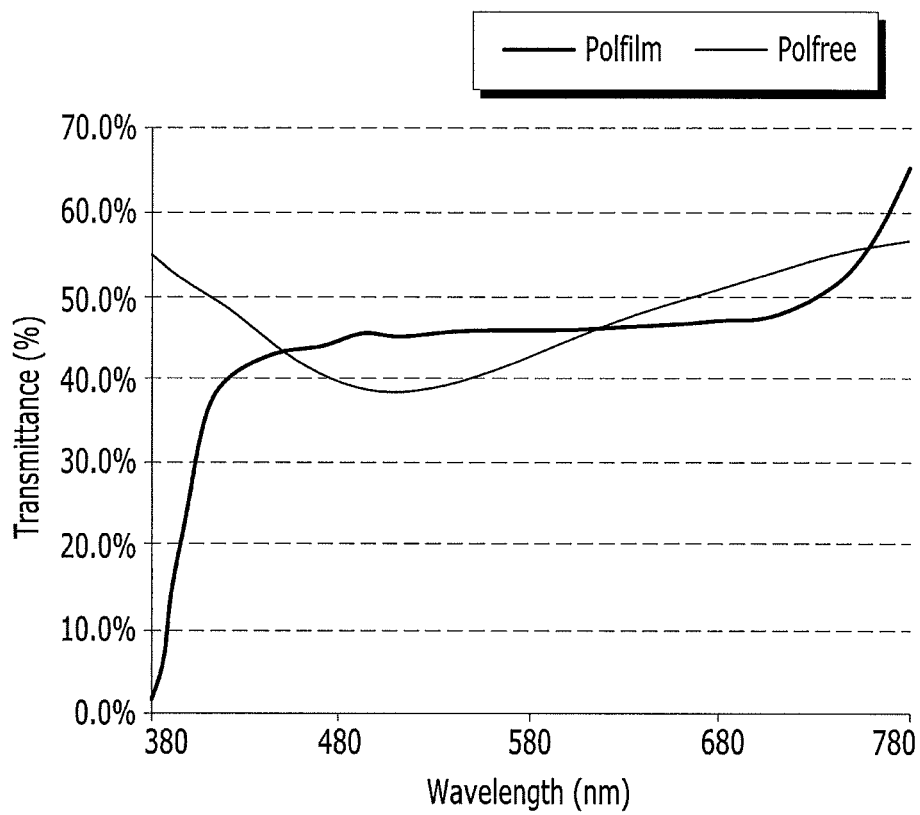

From FIG. 12 which is a graph obtained by measuring the transmittance of Comparative Example 1 and Test Example 3, it is seen that white efficiencies of Comparative Example 1 and Test Example 1 are compared and resultantly turned out to be substantially identical to each other.

Figure 13:
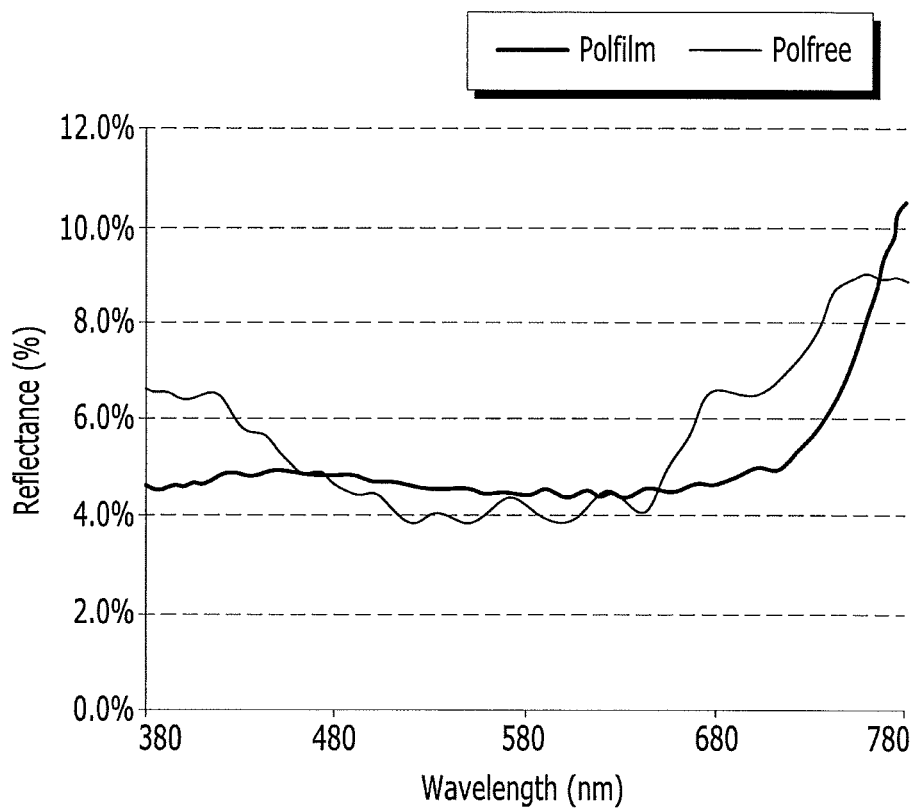

From FIG. 13 which is a graph obtained by measuring the reflectance of Comparative Example 1 and Test Example 4, it is seen that the reflectance according to wavelengths of Comparative Example 1 and Test Example 4 shows similar values in the entire visible wavelength range. The luminous reflectance for determining visibility is 4.6% and 4.1% in Comparative Example 1 and Test Example 4, respectively, which are at substantially the same level.

Figure 14:
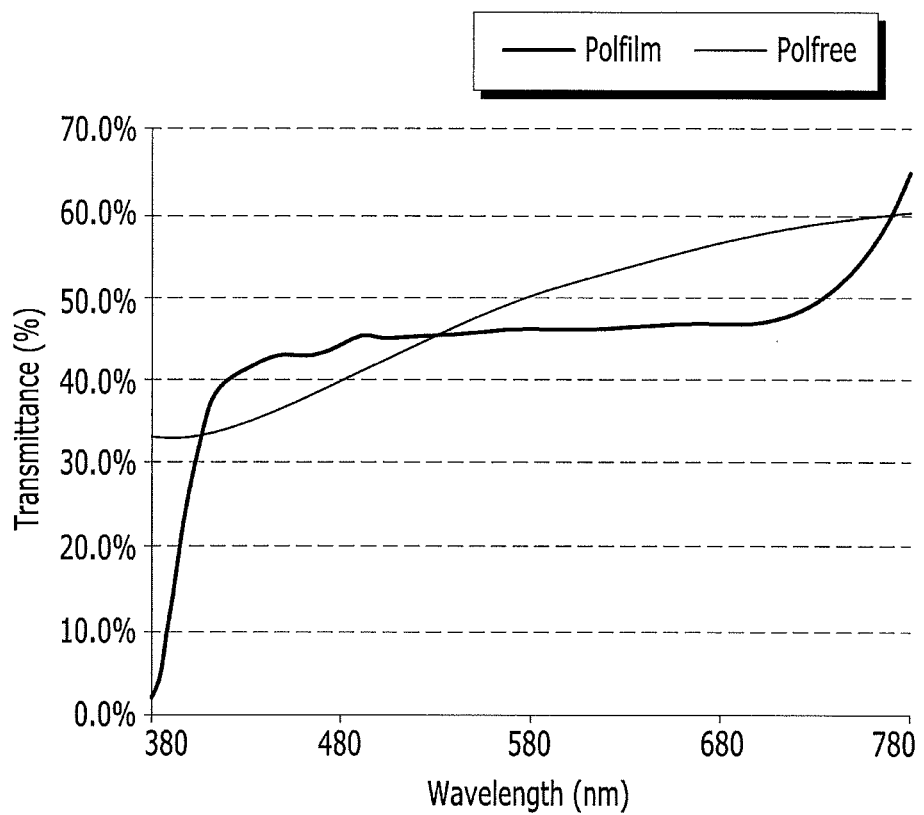

From FIG. 14 which is a graph obtained by measuring the transmittance of Comparative Example 1 and Test Example 4, it is seen that white efficiencies of Comparative Example 1 and Test Example 4 are compared and resultantly turned out to be substantially identical to each other.

Figure 15:
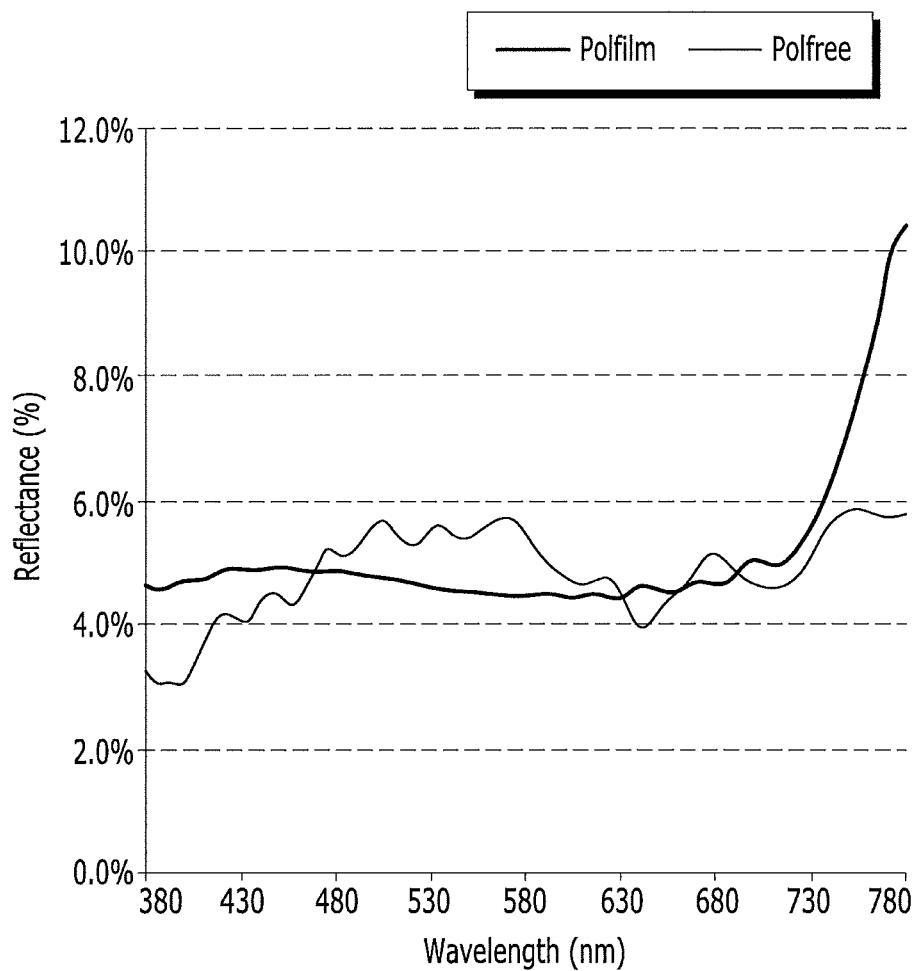

From FIG. 15 which is a graph obtained by measuring the reflectance of Comparative Example 1 and Test Example 5, it is seen that the reflectance according to wavelengths of Comparative Example 1 and Test Example 5 shows similar values in the entire visible wavelength range. The luminous reflectance for determining visibility is 4.6% and 5.3% in Comparative Example 1 and Test Example 5, respectively, showing a slight increase.

Figure 16:
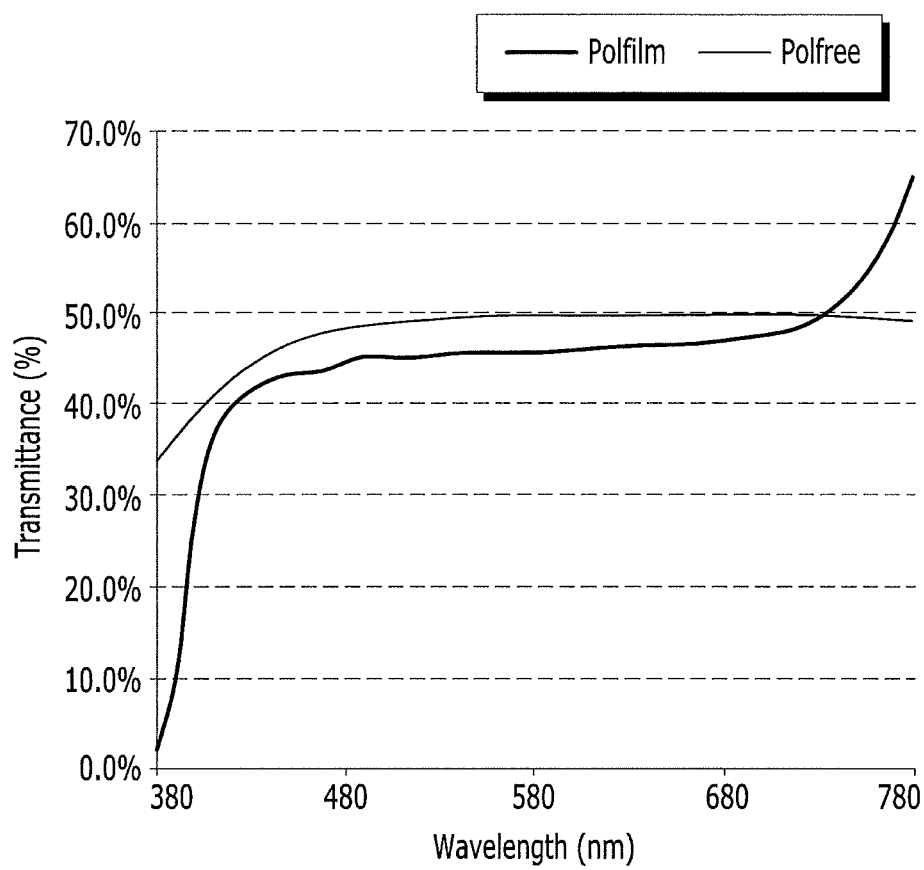

From FIG. 16 which is a graph obtained by measuring the transmittance of Comparative Example 1 and Test Example 5, it is seen that white efficiencies of Comparative Example 1 and Test Example 5 are compared and resultantly turned out to be substantially identical to each other.

Figure 17:
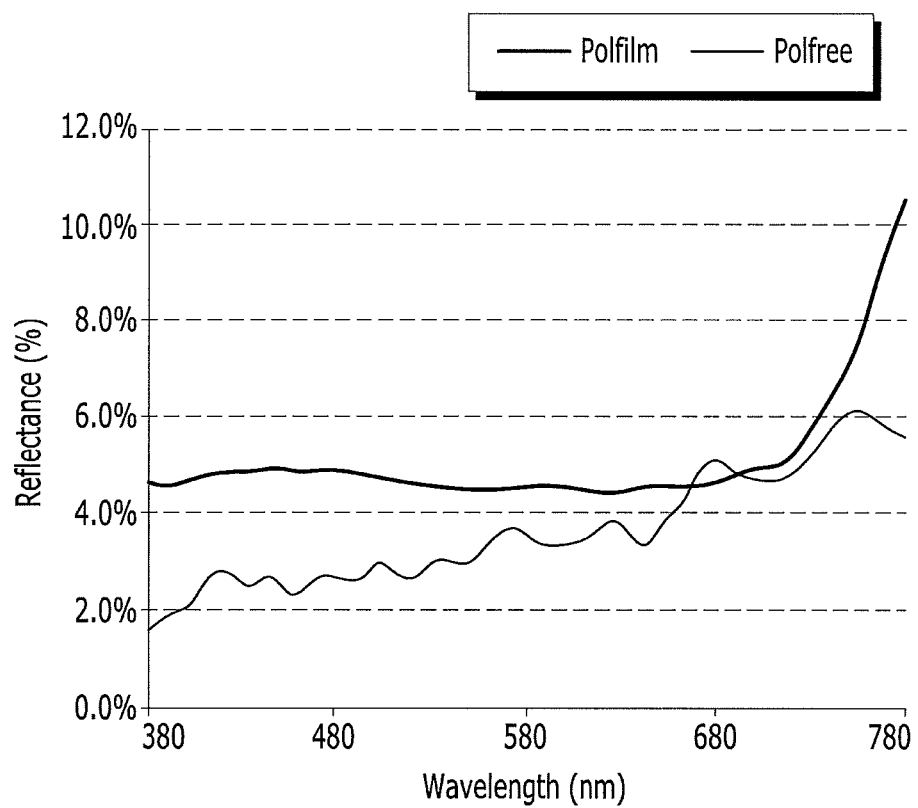

From FIG. 17 which is a graph obtained by measuring the reflectance of Comparative Example 1 and Test Example 6, it is seen that the reflectance according to wavelengths of Comparative Example 1 and Test Example 6 shows similar values in the entire visible wavelength range. The luminous reflectance for determining visibility is 4.6% and 3.2% in Comparative Example 1 and Test Example 6, respectively, showing a slight decrease, so the contrast ratio is improved to obtain better visibility.

Figure 18:
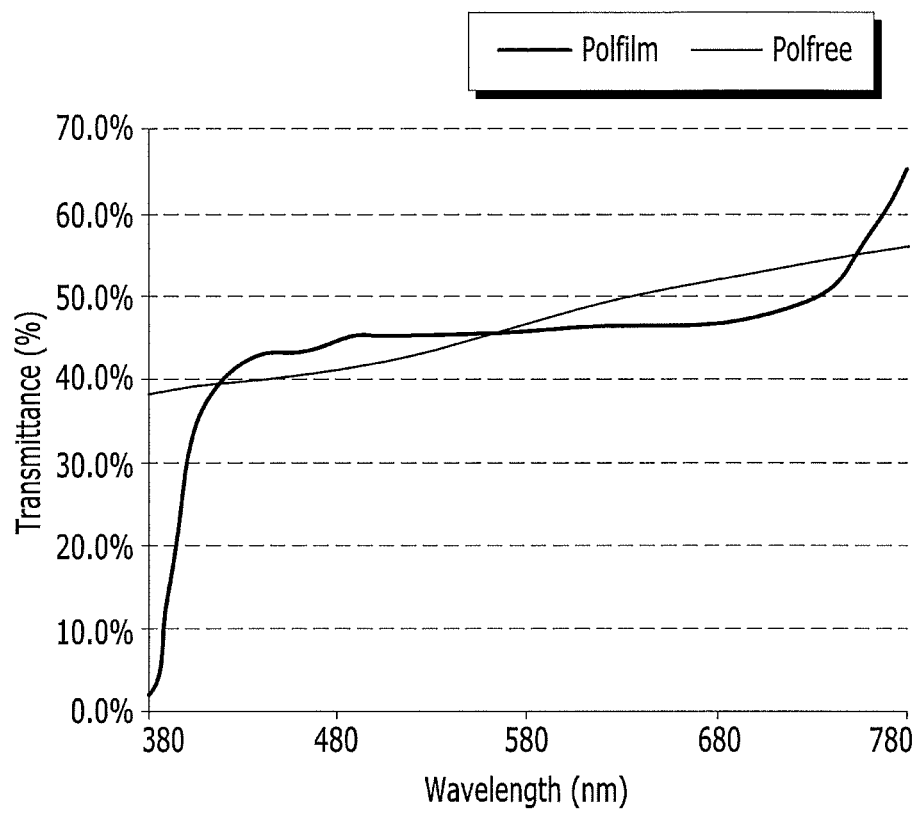

From FIG. 18 which is a graph obtained by measuring the transmittance of Comparative Example 1 and Test Example 6, it is seen that white efficiencies of Comparative Example 1 and Test Example 6 are compared and resultantly turned out to be substantially identical to each other.

Figure 19:
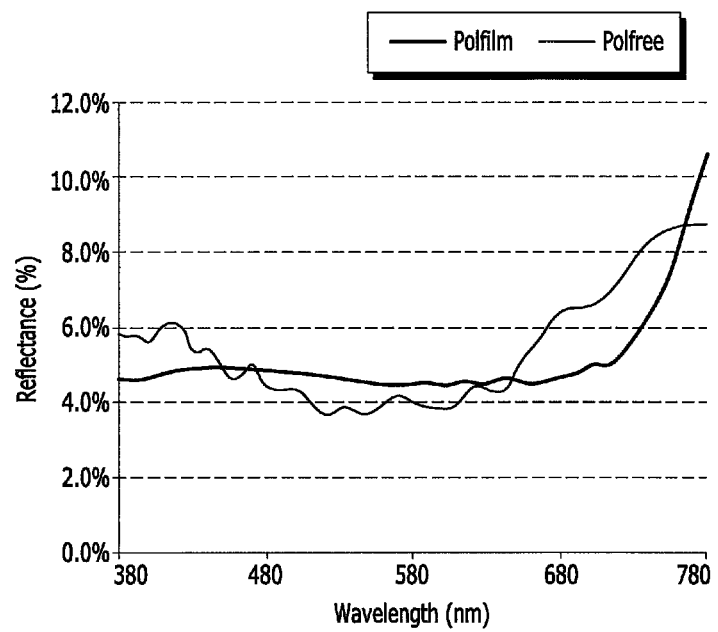

From FIG. 19 which is a graph obtained by measuring the reflectance of Comparative Example 1 and Test Example 7, it is seen that the reflectance according to wavelengths of Comparative Example 1 and Test Example 7 shows similar values in the entire visible wavelength range. The luminous reflectance for determining visibility is 4.6% and 4.0% in Comparative Example 1 and Test Example 7, respectively, which are at a similar level.

Figure 20:
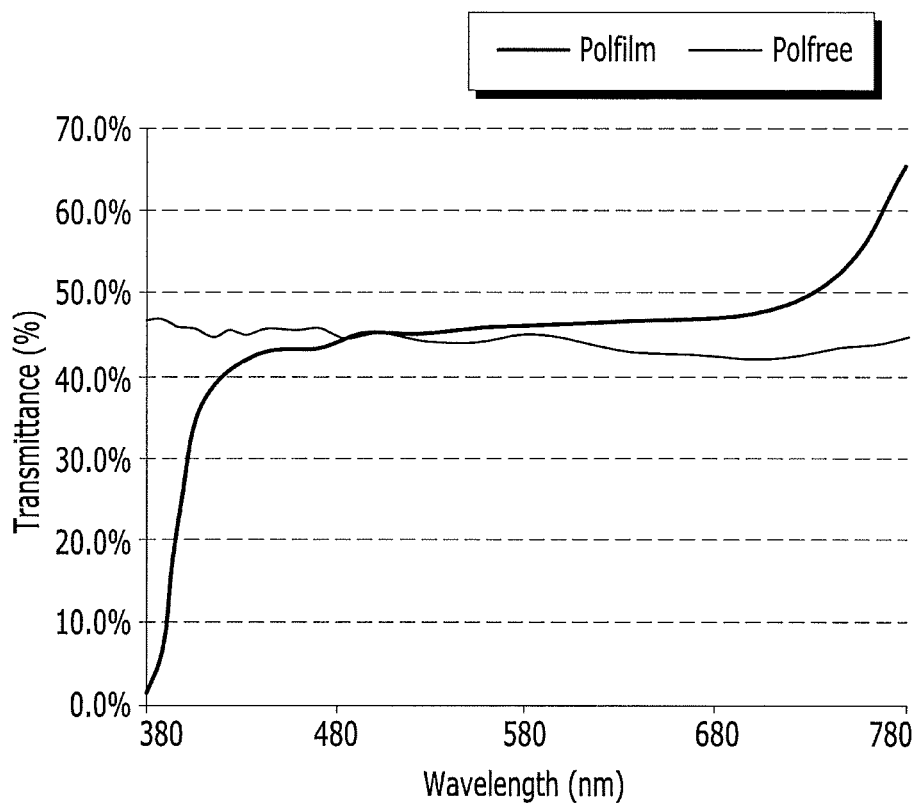

From FIG. 20 which is a graph obtained by measuring the transmittance of Comparative Example 1 and Test Example 7, it is seen that white efficiencies of Comparative Example 1 and Test Example 7 are compared and resultantly turned out to be substantially identical to each other.

Table 1 is a table showing the contrast ratio in Comparative Example 1 (pol-film), and Test Examples 1, 3 and 6 (pol-free A, B, and C), respectively.

TABLE 1

|  | 150 lx | 500 lx | 1000 lx |
| --- | --- | --- | --- |
| pol-film | 140 | 44 | 24 |
| pol-free A | 178 | 56 | 29 |
| pol-free B | 178 | 56 | 29 |
| pol-free C | 200 | 62 | 33 |

Referring to Table 1, it is seen that the contrast ratio of Comparative Example 1 are 140, 44 and 24 at 150 lux (lx), 500 lx and 1000 lx, respectively, but they are increased in Test Example 1 (pol-free A), Test Example 3 (pol-free B) and Test Example 6 (pol-free C).

As such, in one or more exemplary embodiment of an optical unit, it is possible to obtain the transmittance and efficiency of a display device at the same level as that of a display device with a polarizing plate without having to employ the polarizing plate. Accordingly, an overall thickness of the display device can be reduced.

In one or more exemplary embodiment of an optical unit in accordance with the invention, an overall thickness of the optical unit is 3 μm or smaller so as to replace the conventional polarizing plate having a thickness of tens of micrometers. Accordingly, it is possible to reduce the overall thickness of the OLED display when the optical unit is employed in the OLED display. When the OLED display includes a flexible substrate, a polarizing plate of a relatively thick and rigid material is not installed therein. Accordingly, the flexibility characteristic of the OLED display is improved.

Hereinafter, an exemplary embodiment of an OLED display including the optical unit described with reference to FIG. 1 to FIG. 4 will be described in detail with reference to FIG. 21 and FIG. 22.

Figure 21:
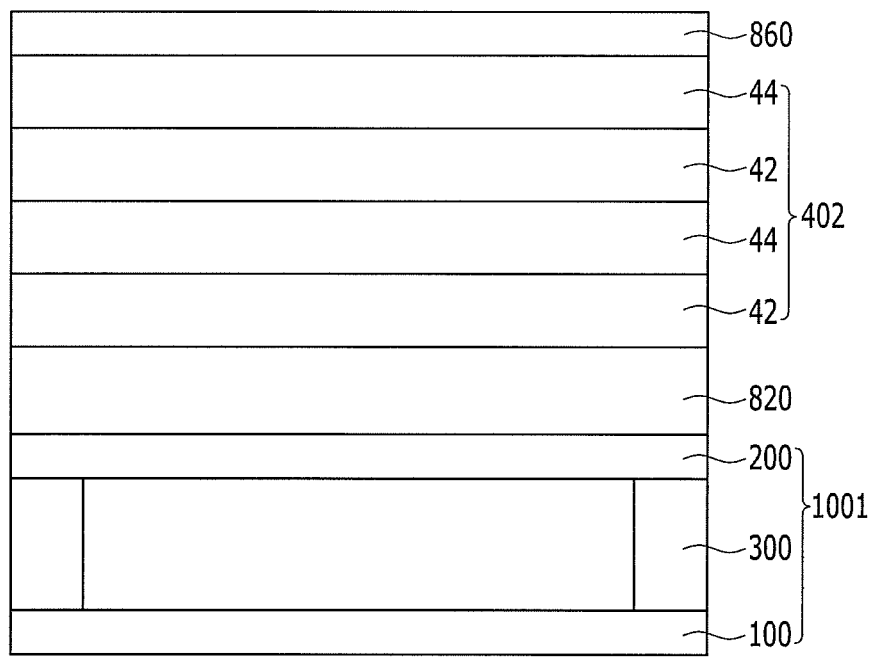
FIG. 21 is a schematic cross-sectional view of an exemplary embodiment of an organic light emitting diode ("OLED") display in accordance with the invention.

FIG. 21 is a schematic cross-sectional view of an exemplary embodiment of an OLED display in accordance with the invention.

As shown in FIG. 21, an exemplary embodiment of the OLED display includes a display panel 1001, a touch panel 820 located on the display panel 1001, an optical unit 402 located on the touch panel 820 and a window 860 located on the optical unit 402.

The display panel 1001 may be a light emitting display panel including an organic light emitting element. The organic light emitting display panel may include a substrate 100, and a plurality of pixels (not shown) disposed on the substrate.

The substrate 100 may be a transparent insulating substrate including glass, quartz, ceramic, plastic and the like, or the substrate 100 may be a metal substrate including a metal material such as stainless steel.

Figure 22:
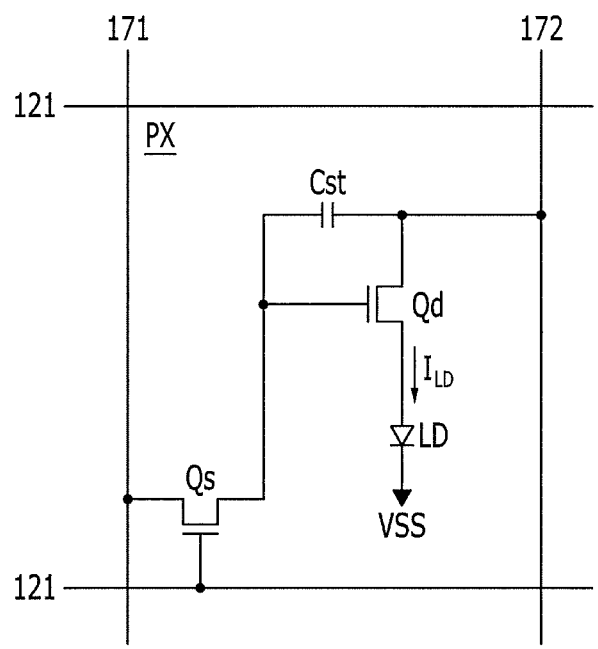
FIG. 22 shows an equivalent circuit of an exemplary embodiment of a pixel on an organic light emitting display panel in accordance with the invention.

With reference to FIG. 22, the organic light emitting display panel including pixels will be described in detail.

FIG. 22 is an equivalent circuit of an exemplary embodiment of a pixel of an organic light emitting display panel in accordance with the invention.

Referring to FIG. 22, the OLED display includes a plurality of signal lines 121, 171 and 172 disposed on the substrate, and pixels PX connected thereto.

The signal lines include scan signal lines 121 for transferring gate signals (or scan signals), data lines 171 for transferring data signals, driving voltage lines 172 for transferring driving voltages, and the like. The scan signal lines 121 extend substantially in a row direction (horizontal in FIG. 22) and substantially parallel with each other, and the data lines 171 extend substantially in a column direction (vertical in FIG. 22) and substantially parallel with each other. The driving voltage lines 172 are shown to extend substantially in the column direction in FIG. 22, but may extend in the row direction or the column direction, and may be disposed in a mesh shape.

One pixel PX includes a switching transistor Qs, a driving transistor Qd, a storage capacitor Cst and an organic light emitting element LD.

The switching transistor Qs has a control terminal connected to the corresponding gate line 121, an input terminal connected to the corresponding data line 171 and an output terminal connected to the driving transistor Qd. The switching transistor Qs transmits a data signal transferred from the data line 171 to the driving transistor Qd in response to a gate signal transferred from the gate line 121.

The driving transistor Qd has a control terminal connected to the switching transistor Qs, an input terminal connected to the driving voltage line 172 and an output terminal connected to the organic light emitting element LD. The driving transistor Qd flows an output current $I_{LD}$ having a magnitude depending on the voltage between the control terminal and the output terminal thereof.

The capacitor Cst is connected between the control terminal and the input terminal of the driving transistor Qd. The capacitor Cst charges a data signal applied to the control terminal of the driving transistor Qd and maintains the charging of the data signal even after the switching transistor Qs is turned off.

The organic light emitting element LD as an OLED has an anode connected to the output terminal of the driving transistor Qd and a cathode connected to a common voltage Vss. The organic light emitting element LD emits light having an intensity depending on the output current $I_{LD}$ of the driving transistor Qd, thereby displaying images. The organic light emitting element LD may include an organic material uniquely emitting light of at least one color among primary colors such as the three primary colors of red, green and blue, and the OLED device displays desired images by spatial sums thereof.

Referring to FIG. 21 again, the touch panel 820 may be a capacitance type or a pressure sensitive type, and senses a touch operation of a user to the OLED display.

The optical unit 402 indicated in FIG. 21 may be one of the optical units 400 of FIG. 1 or FIG. 4, and may be the optical unit 402 of FIG. 1 or FIG. 3.

The optical unit serves to suppress external light reflection by a display panel emitting light and external light reflection by the touch panel sensing the touch operation, thus minimizing a loss of light emitted from the OLED to the outside while improving visibility of the entire display device.

A window 860 is positioned on an optical film and includes a transparent material so that a user can see a display portion at a front side of the display panel. In one exemplary embodiment, for example, the window 860 may have a single layer (monolayer) structure or a multi-layer structure including a plurality of layers, including tempered glass or a polymer material. The polymer material may be polycarbonate ("PC"), polymethylmethacrylate ("PMMA"), polyacrylate ("PA"), polyethersulfone ("PES"), polyethylene terephthalate ("PET") or polyethylene naphthalate ("PEN").

The window 860 is located at the outermost portion of the display device to prevent an internal display panel or the like from being damaged by an external impact.

In FIG. 21, the optical unit is disposed between the touch panel and the window, but may be located at various layers of the display device without being limited thereto. In modified exemplary embodiments, for example, the optical unit may be located above the window, under an encapsulation substrate of the display panel, or between the encapsulation substrate and the touch panel (refer to FIG. 23).

While this disclosure has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. An organic light emitting diode display, comprising:
   a display panel comprising:
      a substrate;
      a plurality of organic light emitting elements which is on the substrate and generates light; and
      an encapsulation substrate configured to seal the organic light emitting elements and through which the light is emitted from the display panel;
   an optical unit on the display panel and facing a surface of the encapsulation substrate through which the light is emitted from the display panel, the optical unit comprising a metal material film and a dielectric material film each of which extends to overlap an entirety of the encapsulation substrate to define transmittance of the optical unit about 43% or higher and
   a window on the optical unit,
   wherein
   the metal material film and the dielectric material film are provided in plural and are alternately stacked, and
   the optical unit further comprises:
      a first metal material film on the encapsulation substrate,
      a first dielectric material film on the first metal material film,
      a second metal material film on the first dielectric material film, and
      a second dielectric material film on the second metal material film,
   wherein among all the metal material films of the optical unit,
   the first metal material film is closest to the display panel and the second metal material film is furthest from the display panel, and
   a metal of the second metal material film furthest from the display panel has lower reflectance and a higher absorption rate than those of a metal of the first metal material film closest to the display panel.

2. The organic light emitting diode display of claim 1, wherein the metal material film has an optical absorption rate of about 40% or higher and a refractive index ranging from about 0.5 to about 7.

3. The organic light emitting diode display of claim 2, wherein the metal material film comprises one of Al, Ag, Mg, Cr, Ti, Ni, Au, Ta, Cu, Ca, Co, Fe, Mo, W, Pt, Yb, NiS, a combination thereof, or an alloy thereof, or comprises one of a metal oxide and a metal nitride, and a combination thereof.

4. The organic light emitting diode display of claim 1, wherein the dielectric material film comprises one of $SiO_2$, $TiO_2$, LiF, $CaF_2$, $MgF_2$, SiNx, $Ta_2O_5$, $Nb_2O_5$, SiCN, $SiO_x$, $TiO_x$, $ZrO_2$, MgO, CaO, $Y_2O_3$, $ThF_4$, $YF_3$, $Al_xO_y$, $SiO_xN_y$, $ZrO_xF_y$, $SiO_xF_y$, $AlO_xN_y$, an acryl, a polymer acryl, a polyimide, a polycarbonate, polymethlymethacrylate, polystyrene, polyester, polyethylene, polyethylene terephthalate and a combination thereof.

5. The organic light emitting diode display of claim 1, further comprising:
   a touch panel between the optical unit and the encapsulation substrate.

6. An organic light emitting diode display, comprising:
   disposed in order,
      a substrate;
      a plurality of organic light emitting elements on the substrate;
      an encapsulation substrate configured to seal the organic light emitting elements; and
      an optical unit comprising a metal material film and a dielectric material film, each of the metal material film and the dielectric film provided in plural and extended to overlap an entirety of the encapsulation substrate to define transmittance of the optical unit about 43% or higher,
   wherein
   an overall thickness of the optical unit comprising each of the metal material film and the dielectric film provided in plural and extended to overlap the entirety of the encapsulation substrate, is equal to or smaller than about 3 micrometers, and
   in the overall thickness equal to or smaller than about 3 micrometers of the optical unit, a total thickness of the plural dielectric material films is equal to or smaller than about 2.5 micrometers,
   wherein
   the plural metal material film and the plural dielectric material film are alternately stacked, and
   the optical unit further comprises:
      a first metal material film on the encapsulation substrate,
      a first dielectric material film on the first metal material film,
      a second metal material film on the first dielectric material film, and
      a second dielectric material film on the second metal material film,
   wherein among all the metal material films of the optical unit,
   the first metal material film is closest to the display panel and the second metal material film is furthest from the display panel, and
   a metal of the second metal material film furthest from the display panel has lower reflectance and higher absorption rate than those of a metal of the first metal material film closest to the display panel.

7. The organic light emitting diode display of claim 6, wherein the metal material film has an optical absorption rate of about 40% or higher and a refractive index ranging from about 0.5 to about 7.

8. The organic light emitting diode display of claim 7, wherein the metal material film comprises one of Al, Ag, Mg, Cr, Ti, Ni, Au, Ta, Cu, Ca, Co, Fe, Mo, W, Pt, Yb, NiS and a combination thereof, or an alloy thereof, or comprises one of a metal oxide and a metal nitride, and a combination thereof.

9. The organic light emitting diode display of claim 6, wherein the dielectric material film comprises one of $SiO_2$, $TiO_2$, LiF, $CaF_2$, $MgF_2$, $SiN_x$, $Ta_2O_5$, $Nb_2O_5$, SiCN, $SiO_x$, $TiO_x$, $ZrO_2$, MgO, CaO, $Y_2O_3$, $ThF_4$, $YF_3$, $Al_xO_y$, $SiO_xN_y$, $ZrO_xF_y$, $SiO_xF_y$, $AlO_xN_y$, an acryl, a polymer acryl, a polyimide, a polycarbonate, polymethlymethacrylate, polystyrene, polyester, polyethylene, and polyethylene terephthalate, and a combination thereof.

10. An organic light emitting diode display comprising:
a display panel comprising:
    a substrate;
    a plurality of organic light emitting elements which is on the substrate and generates light; and
    an encapsulation substrate configured to seal the organic light emitting elements and through which the light is emitted from the display panel;
a touch panel on the display panel;
a window on the display panel; and
an optical unit on the display panel and facing a surface of the encapsulation substrate through which the light is emitted from the display panel, the optical unit comprising a metal material film and a dielectric material film each of which extends to overlap an entirety of the encapsulation substrate,
wherein
the optical unit comprising the metal material film and the dielectric material film each of which extends to overlap the entirety of the encapsulation substrate is disposed between the encapsulation substrate and the touch panel, transmittance of the optical unit disposed between the encapsulation substrate and the touch panel is about 43% or higher,
the metal material film and the dielectric material film are provided in plural and are alternately stacked, and
the optical unit further comprises:
    a first metal material film on the encapsulation substrate,
    a first dielectric material film on the first metal material film,
    a second metal material film on the first dielectric material film, and
    a second dielectric material film on the second metal material film,
wherein among all the metal material films of the optical unit,
the first metal material film is closest to the display panel and the second metal material film is furthest from the display panel, and
a metal of the second metal material film furthest from the display panel has lower reflectance and higher absorption rate than a metal of the first metal material film closest to the display panel.

11. The organic light emitting diode display of claim 1, wherein the optical unit is contacted directly with the encapsulation substrate.

* * * * *